(12) United States Patent
Eugene Lee et al.

(10) Patent No.: US 10,804,114 B2
(45) Date of Patent: Oct. 13, 2020

(54) METHODS FOR MAKING A MULTILEVEL LEADFRAME BY ETCHING A CONDUCTIVE SHEET FROM TWO OPPOSITE SIDES

(71) Applicant: Texas Instruments Incorporated, Dallas, TX (US)

(72) Inventors: Lee Han Meng@ Eugene Lee, Muar (MY); You Chye How, Melaka (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 278 days.

(21) Appl. No.: 15/138,298

(22) Filed: Apr. 26, 2016

(65) Prior Publication Data

US 2016/0240390 A1 Aug. 18, 2016

Related U.S. Application Data

(60) Division of application No. 14/581,006, filed on Dec. 23, 2014, now abandoned, which is a continuation of
(Continued)

(51) Int. Cl.
*H01L 21/48* (2006.01)
*H01L 23/31* (2006.01)
(Continued)

(52) U.S. Cl.
CPC ...... *H01L 21/4828* (2013.01); *H01L 21/4825* (2013.01); *H01L 23/3107* (2013.01);
(Continued)

(58) Field of Classification Search
CPC .............. H01L 23/49503; H01L 24/97; H01L 21/4828; H01L 23/3107; H01L 23/49548;
(Continued)

(56) References Cited

U.S. PATENT DOCUMENTS 6,674,156 B1 * 1/2004 Bayan ................. H01L 23/3107
257/666
7,186,588 B1 3/2007 Bayan et al.
(Continued)

FOREIGN PATENT DOCUMENTS

CN 1222252 A 7/1999
CN 101826501 A 9/2010

*Primary Examiner* — Nelson Garces
(74) *Attorney, Agent, or Firm* — Dawn Jos; Charles A. Brill; Frank D. Cimino

(57) ABSTRACT

A method for forming a multilevel leadframe for an integrated circuit is provided. A conductive sheet is etched from one side to form a thinner region within a frame region for leads lines and bond pads. The conductive sheet is etched to form a plurality of bond pads in a first level of the thinner region arranged in at least a first row and a second row. Each bond pad has a pad width and is separated from an adjacent bond pad by a bond pad clearance distance. The conductive sheet is etched from an opposite side to form a plurality of lead lines in a second level of the thinner region having a line width and is separated from an adjacent lead line by at least a lead line clearance distance. Each bond pad of the second plurality of bond pads is connected to one of the plurality of lead lines on the second level that is routed between adjacent bond pads in the first row, so that the lead lines are routed on a different level from the bond pads.

15 Claims, 8 Drawing Sheets

Related U.S. Application Data application No. 13/902,916, filed on May 27, 2013, now abandoned.

(51) Int. Cl.
*H01L 23/495* (2006.01)
*H01L 23/00* (2006.01)

(52) U.S. Cl.
CPC .. *H01L 23/49503* (2013.01); *H01L 23/49548* (2013.01); *H01L 24/97* (2013.01); *H01L 2924/181* (2013.01)

(58) Field of Classification Search
CPC . H01L 2924/181; H01L 21/4821–4842; H01L 23/49582; H01L 21/02019; H01L 21/30604–30621; H01L 21/3063–30635; H01L 21/3065–30655; H01L 21/31055–31056; H01L 21/31111–31122; H01L 21/31133–31138; H01L 21/32133–32139; H01L 21/465
USPC .................................................. 257/670–681
See application file for complete search history.

(56) References Cited

U.S. PATENT DOCUMENTS

| | | | |
|---|---|---|---|
| 8,072,053 B2 | 12/2011 | Li | |
| 2009/0160067 A1 | 6/2009 | Bayan et al. | |
| 2010/0270571 A1* | 10/2010 | Seo | H01L 33/486 257/98 |
| 2015/0108531 A1* | 4/2015 | Schwarz | H01L 21/4828 257/666 |

* cited by examiner

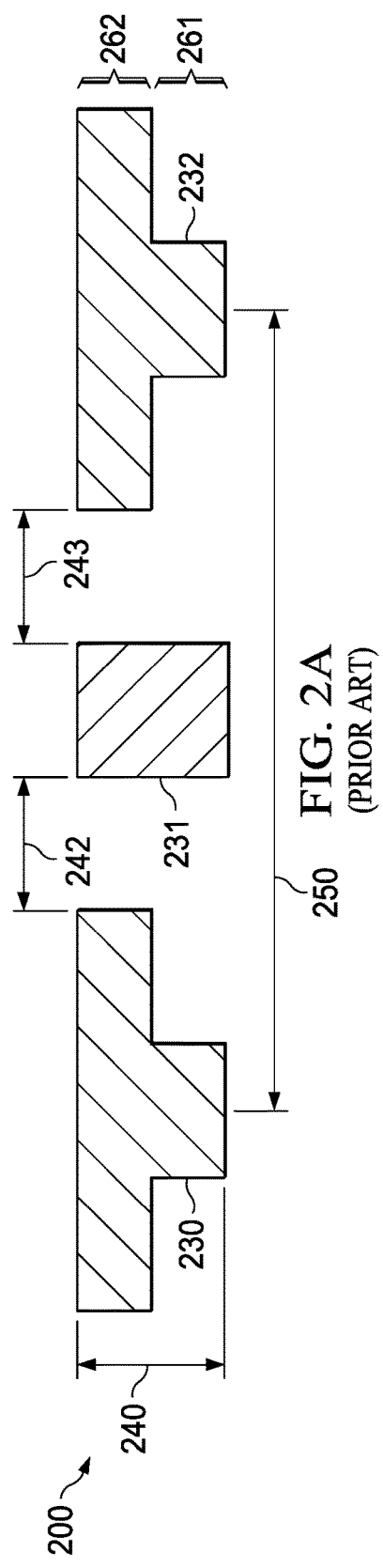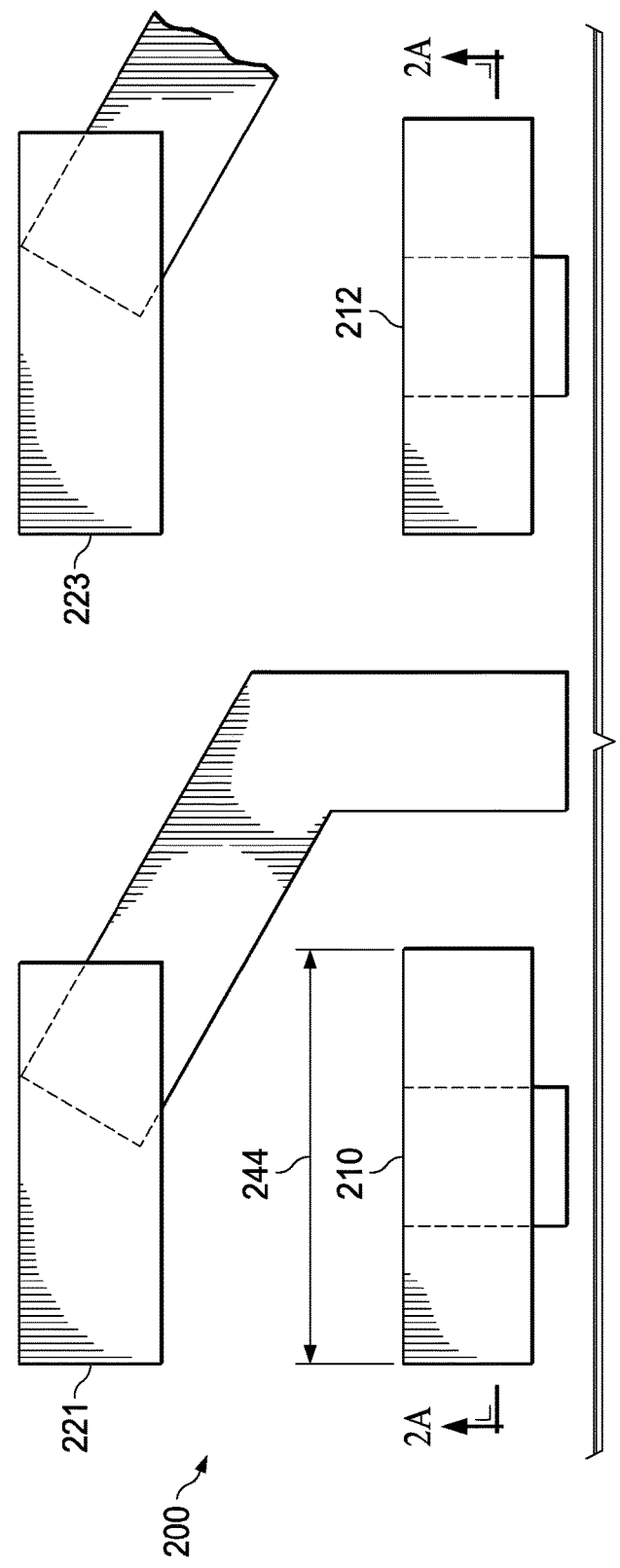
FIG. 2A (PRIOR ART)
FIG. 2B (PRIOR ART)

METHODS FOR MAKING A MULTILEVEL LEADFRAME BY ETCHING A CONDUCTIVE SHEET FROM TWO OPPOSITE SIDES

CROSS-REFERENCE TO RELATED APPLICATION

This application is a Divisional of and claims priority to U.S. application Ser. No. 14/581,006, filed on Dec. 23, 2014. which is a continuation of and claims priority to U.S. application Ser. No. 13/902,916, filed on May 27, 2013. Said applications are incorporated herein by reference in their entireties.

BACKGROUND

The embodiments of the invention generally relate to packaging of integrated circuits, and in particular to a multilevel leadframe for a dense array of contacts.

A chip scale package (CSP) is a type of integrated circuit chip carrier. In order to qualify as chip scale, the package typically has an area that is less than 1.2 times that of the die and is a single-die, direct surface mountable package. Another criterion that is often applied to qualify these packages as CSPs is their ball pitch is typically less than 1 mm.

An integrated circuit die may be mounted on an interposer upon which pads or balls are formed, such as a flip chip ball grid array (BGA) package, or the pads may be etched or printed directly onto the silicon wafer, resulting in a package very close to the size of the silicon die. Such a package may be called a wafer-level chip-scale package (WL-CSP) or (WCSP), or a wafer-level package (WLP), for example.

Flip chip technology is a surface mount technology in which the semiconductor die is "flipped" over such that the active surface of the die faces downward to the interconnect substrate. For flip chip packaging, a leadframe may be used as the interconnect substrate to produce a plastic molded enclosure, also referred to as a "molded package". The leadframe may be fabricated from a metal, for example, copper, and includes a number of leads which are secured to the frame. Electrical contact between the active surface of the die and the interconnect substrate is achieved by utilizing an area array of small solder "bumps" that are planted on pads on the active surface of the die. After the die is placed faced down on the interconnect substrate, the temperature is increased and the solder in the flip chip solder bumps reflows, bonding the die directly to the interconnect on the substrate. As such, the die makes electrical and mechanical connection directly to the interconnect substrate without the use of bond wires. Flip chip technology provides a configuration that eliminates wire bonding and allows shorter interconnections between circuits and components, which results in thermal, electrical, and mechanical advantages.

BRIEF DESCRIPTION OF THE DRAWINGS

Particular embodiments in accordance with the invention will now be described, by way of example only, and with reference to the accompanying drawings:

FIG. 2A is a sectional view and FIG. 2B is top view of a portion of a prior art leadframe;

Figure 1:
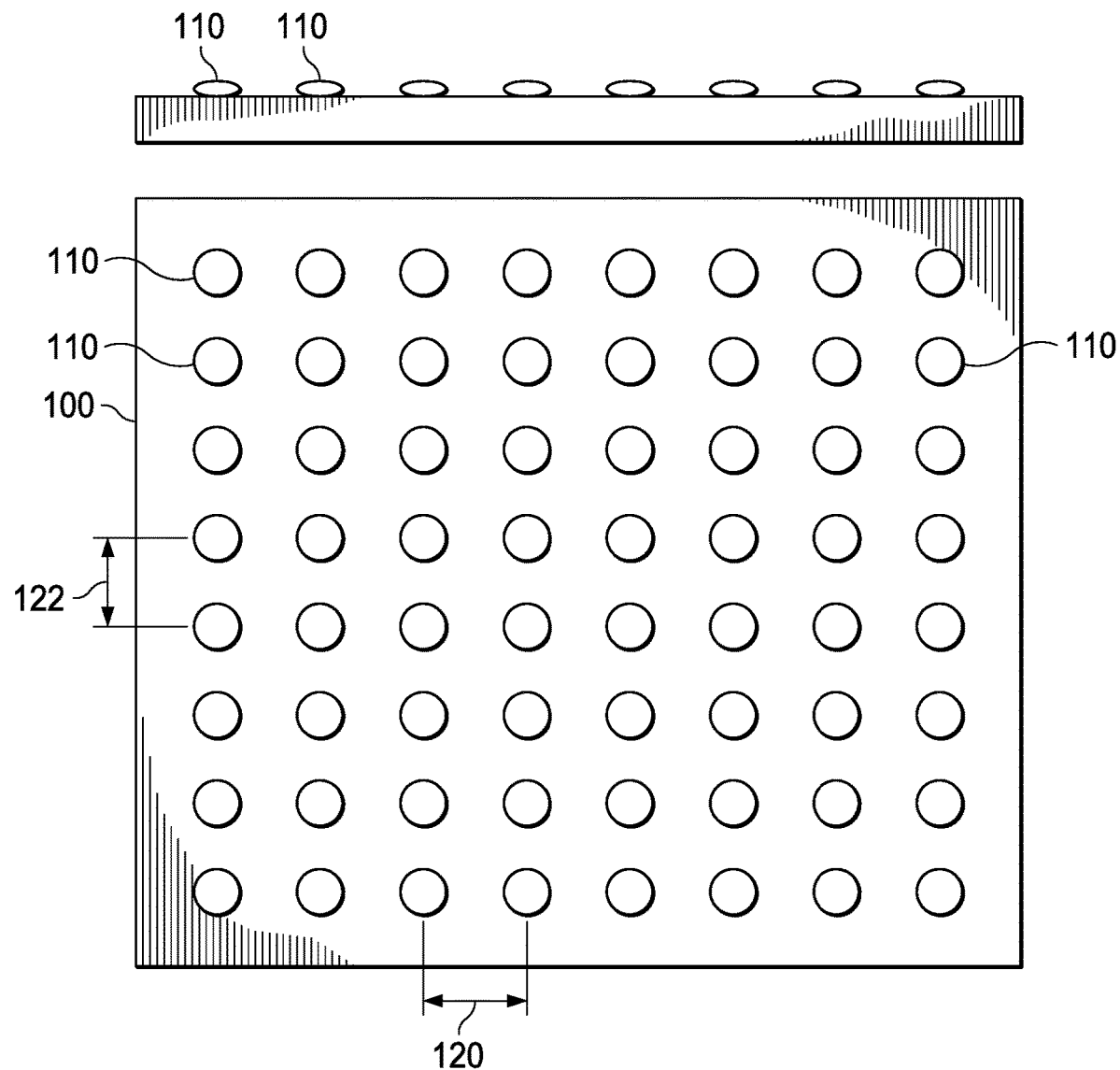
FIG. 1 is an illustration of a known chip scale package with an array of bond pads.

Other features of the present embodiments will be apparent from the accompanying drawings and from the detailed description that follows.

DETAILED DESCRIPTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

A ball grid array (BGA) package, wafer-level chip-scale package (WL-CSP or WCSP), and a wafer-level package (WLP) all have one thing in common; they each have a large number of densely packed pins that may be attached to a leadframe. Typically, a chip scale package (CSP) may have an array of pins that are spaced apart by 1 mm, or less.

Current leadframe based flip chip packages are limited by the number of solder bumps arranged in an array pattern on the WCSP. An issue with current flip chip leadframes is the amount of space it takes to route the lead wires through a row of bond pads, based on currently available leadframe manufacturing capability.

FIG. 1 is an illustration of an example chip scale package 100 with an array of solder bumps 110 that are formed on each interface signal pads of CSP 100. The array of solder bumps 110 is generally arranged in a square array or in a rectangular Cartesian grid array in which the horizontal pitch 120 and the vertical pitch 122 are equal. In order for a leadframe to be mated to CSP 100, the pitch of the bond pads on the leadframe must match the pitch of solder balls 110.

FIGS. 2A, 2B are a sectional view and a top view of a portion of a prior art leadframe 200. Bond pads 210, 212 are in a first row of bond pads that also includes additional bond pads that are not shown. Likewise, bond pads 221, 223 are in a second row of bond pads that also includes additional bond pads that are not shown. Each bond pad is connected to a lead line, such as lead lines 230-232. The metal sheet from which the leadframe is fabricated has a thickness 240 that will be referred to as thickness D. Leadframe 200 may be fabricated by a double etch process. A first etch step 261 removes a portion of the leadframe material to form the bottom half of lead lines 230-232. A second etch step 262 then removes a portion of the leadframe material to form the top half of the lead lines and to define the bond pads.

Notice that lead line 231 must go between bond pads 210 and 212 in order to connect to bond pad 221. A clearance distance 242, referred to as clearance distance d, is formed during the double etch process. For a wet etch process, typically a minimum distance d is equal to the thickness that the etch must be able to remove. Therefore, in this case, clearance distance d is approximately equal to thickness D. Each bond pad has a width 244, referred to as width W, that is determined by what is required to reliably connect to the solder balls of the CSP. Each lead line has a width that may be determined by current capacity requirements, transmission line properties, etc. Thus, the minimal pitch 250 that can be fabricated is limited by bond pad width W, the lead line width, and two occurrences 242, 243 of clearance distance d.

Figure 3A:
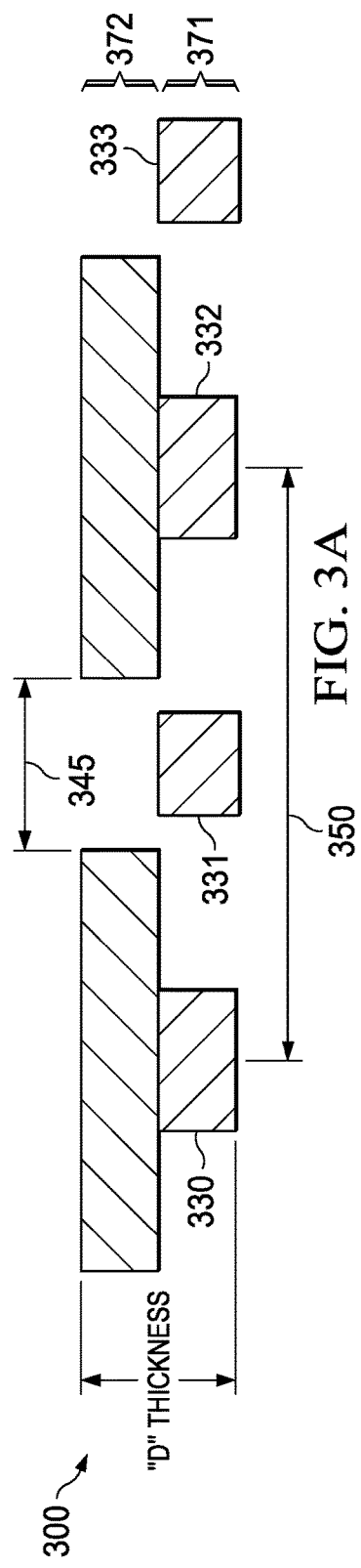
FIG. 3A is a sectional view and FIG. 3B is a top view of a portion of a multilevel leadframe.
Figure 3B:
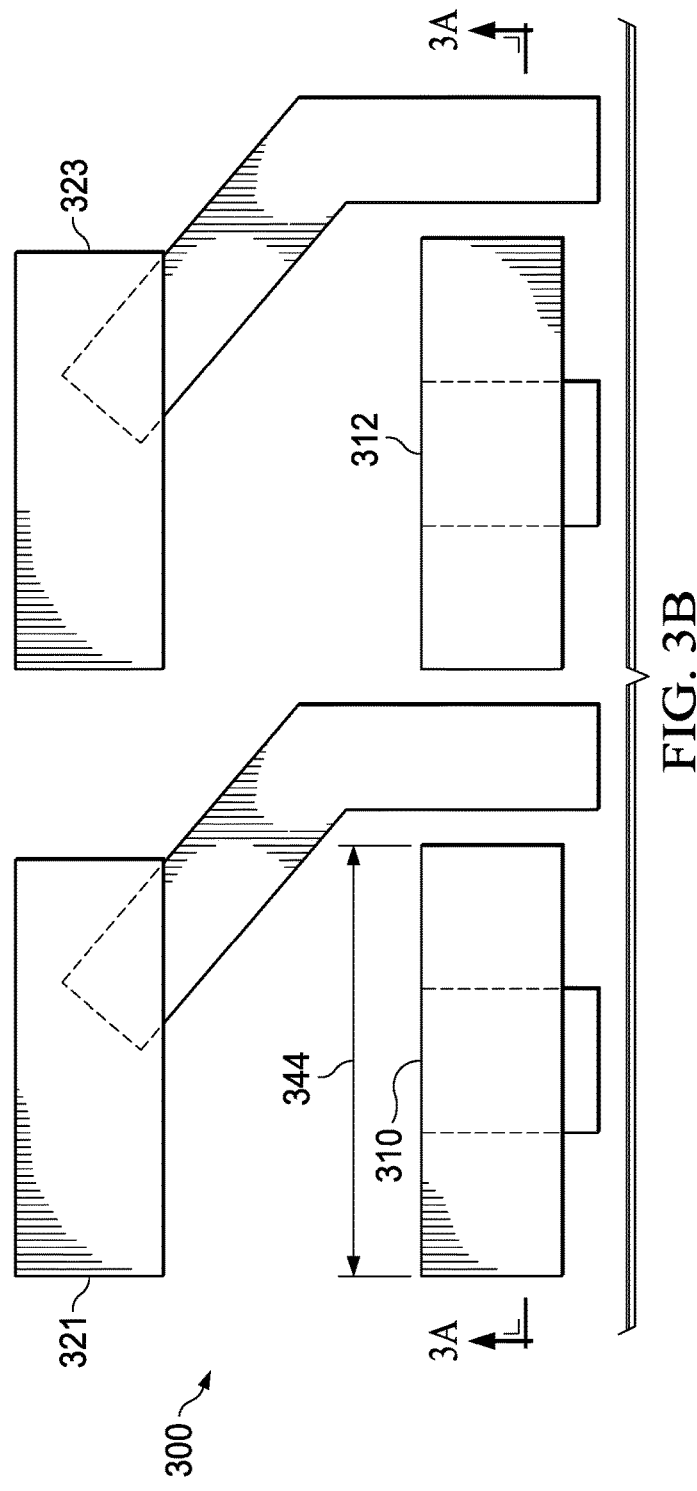

FIGS. 3A, 3B are a sectional view and a top view of a portion of a multilevel leadframe 300. Bond pads 310, 312 are in a first row of bond pads that also includes additional bond pads that are not shown. Likewise, bond pads 321, 323 are in a second row of bond pads that also includes additional bond pads that are not shown. Each bond pad is connected to a lead line, such as lead lines 330-333. In this example, a cavity is formed in the metal sheet by reducing the thickness of a center region of the lead frame for an integrated circuit die. The thickness of the reduced center region is referred to as thickness D. Leadframe 300 may be fabricated by a triple etch process that will be described in more detail below.

Notice again that lead line 331 must go between bond pads 310 and 312 in order to connect to bond pad 321. A lead line clearance distance d is formed during the etch process. As described above, for a wet etch process, typically a minimum distance d is equal to the thickness that the etch must be able to remove. Therefore, in this case, clearance distance d is approximately equal to thickness D. Each bond pad has a width W, such as width 344, that is determined by a width that is required to reliably connect to the solder balls of the CSP. Each lead line has a width that may be determined by current capacity requirements, transmission line properties, etc.

Notice that a triple etch process allows the lead lines to be formed on a lower level 371 while the bond pads are formed on an upper level 372. This allows bond pads in the first row, such as bond pads 310, 312, to be spaced closer together because only one clearance distance 345 is required, rather than allowing for a lead line and two clearance distances as in prior art leadframe 200. Thus, in improved leadframe 300, the minimal pitch 350 that can be fabricated is limited only by bond pad width W and a single clearance distance d.

Thus, embodiments of the current invention may provide a leadframe for flip chip package application that allows lead routing to accommodate more bumps in an array pattern.

Figure 4A:
FIGS. 4A-4G illustrate a triple etch process for forming the leadframe of FIG. 3.

FIGS. 4A-4G illustrate a triple etch process for forming the leadframe of FIG. 3. Initially, a bare copper sheet is formed into a strip. FIG. 4A illustrates a portion of a copper strip 400 that will be formed into a leadframe. While a copper sheet is typically used for leadframes, other types of conductive material or alloys of copper may also be used; for example, Cu—Sn, Cu—Fe—P, Cu—Cr—Sn—Zn, etc. Various alloys may be selected to use for a particular CSP based on conductivity, tinsel strength, thermal expansion rates, etc.

Figure 4B:
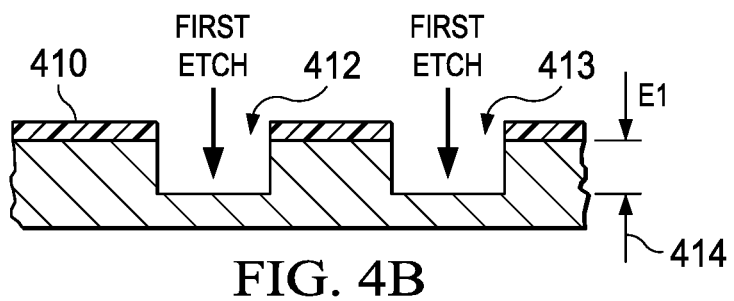

FIG. 4B illustrates first etch mask 410 that is applied to sheet 400 that will be used to form a first etched pattern on sheet 400. Mask 410 may be formed on sheet 400 using known application techniques. For example, a photo sensitive mask material may be applied to sheet 400 and then exposed to light through a reticule that contains an image of the pattern to be etched. Unexposed areas may then be washed away with a suitable solvent. Alternatively, the mask may be applied using a silkscreen process, or other known or later developed application process. Once the first mask 410 is in place, exposed regions such as 412, 413 of copper sheet 400 are etched away using suitable etchant. The etch process is allowed to proceed to a depth E1 as indicated at 414. Depth E1 is less than the thickness of sheet 400.

Figure 4C:
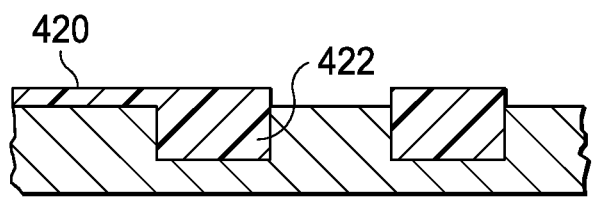

FIG. 4C illustrates second etch mask 420 that is applied to sheet 400 that will be used to form a second etched pattern on sheet 400. Mask 420 may be formed on sheet 400 using known application or later developed techniques, as described above. Previously etched regions, such as indicated at 422, may be covered by second etch mask 420.

Figure 4D:
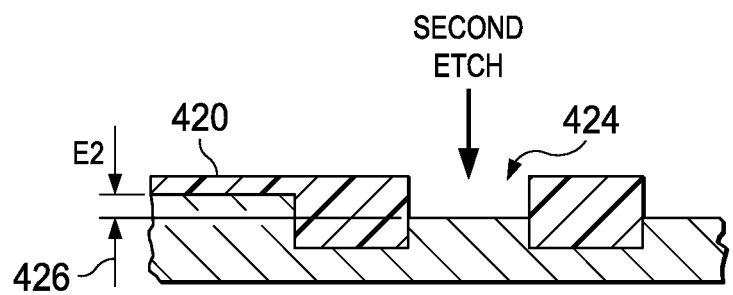

Once the second mask 420 is in place, exposed regions such as 424 of copper sheet 400 are etched away using suitable etchant as illustrated in FIG. 4D. The etch process is allowed to proceed to a depth E2 as indicated at 426. Depth E2 is less than depth E1. In this manner, at least two rows of bond pads may be formed in first level of the multilevel lead frame that are separated from an adjacent bond pad by a bond pad clearance distance.

Figure 4E:
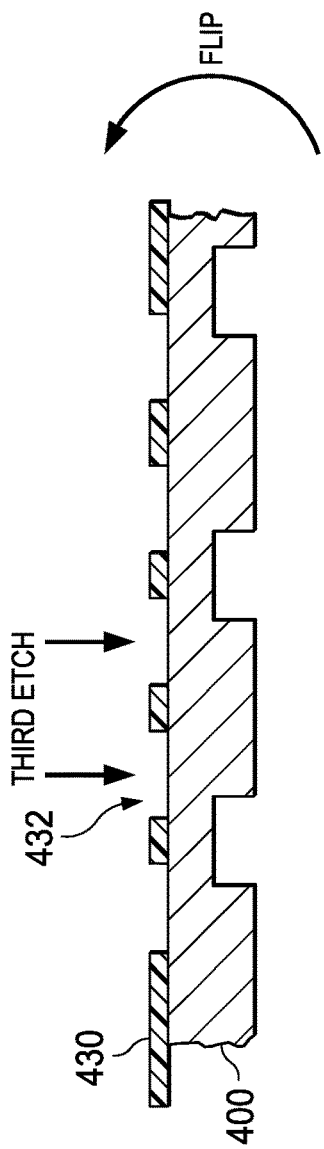
Figure 4F:
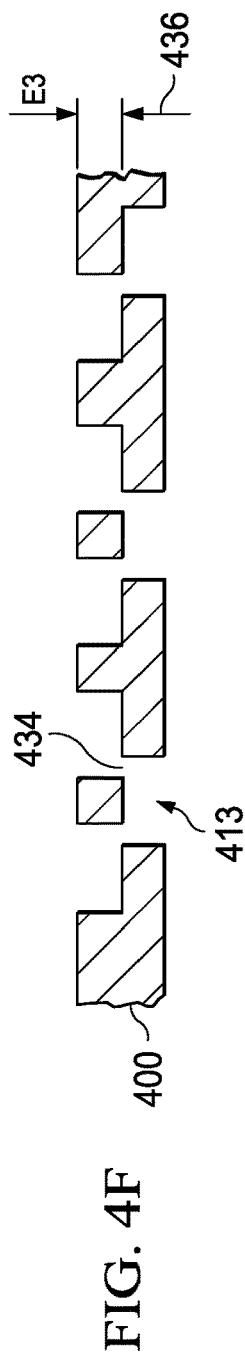

Sheet 400 may then be inverted and a third mask 430 applied to the back side of sheet 400 as indicated in FIG. 4E using known or later developed techniques as described above. Once the third mask 430 is in place, exposed regions such as 432 of copper sheet 400 are etched away using suitable etchant as illustrated in FIG. 4F. The etch process is allowed to proceed to a depth E3 as indicated at 436. In regions such as where exposed region 432 is aligned with previously etched region 413, an opening through sheet 400 will be formed, such as indicated by opening 434 in FIG. 4F. In this manner, portions of sheet 400 may be completely removed to form the lead lines in a second level of multilevel leadframe 440, as illustrated in FIG. 3.

Figure 4G:
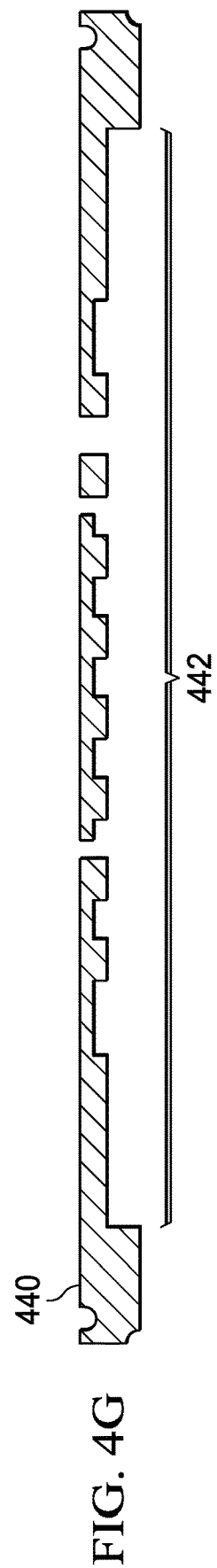

FIG. 4G illustrates a cross section of a completely etched multilevel leadframe 440 using the triple etch process described above. Each bond pad in the second row of bond pads may be connected to a lead line on the first level that is routed between adjacent bond pads in the first row. Note that because the bond pads are located on the second level, the lead lines are routed on a different level from the bond pads and therefore the bond pads may be located closer together.

Note also that a die cavity 442 is formed by the triple etch process. This provides a cavity in which a die is placed in a manner that the back of the die may contact the substrate to which the flip chip package is mounted. This may improve thermal performance.

In another embodiment, the order of etching may be different. For example, mask 420 may be applied first and etching performed to depth E2, followed by application of mask 410 and etching performed to depth E1. In another example, mask 430 may be applied to the bottom side of copper sheet 400 while mask 410 or 420 is applied to the top side of copper sheet 400 and then both sides may be etched in a single operation.

Figure 5A:
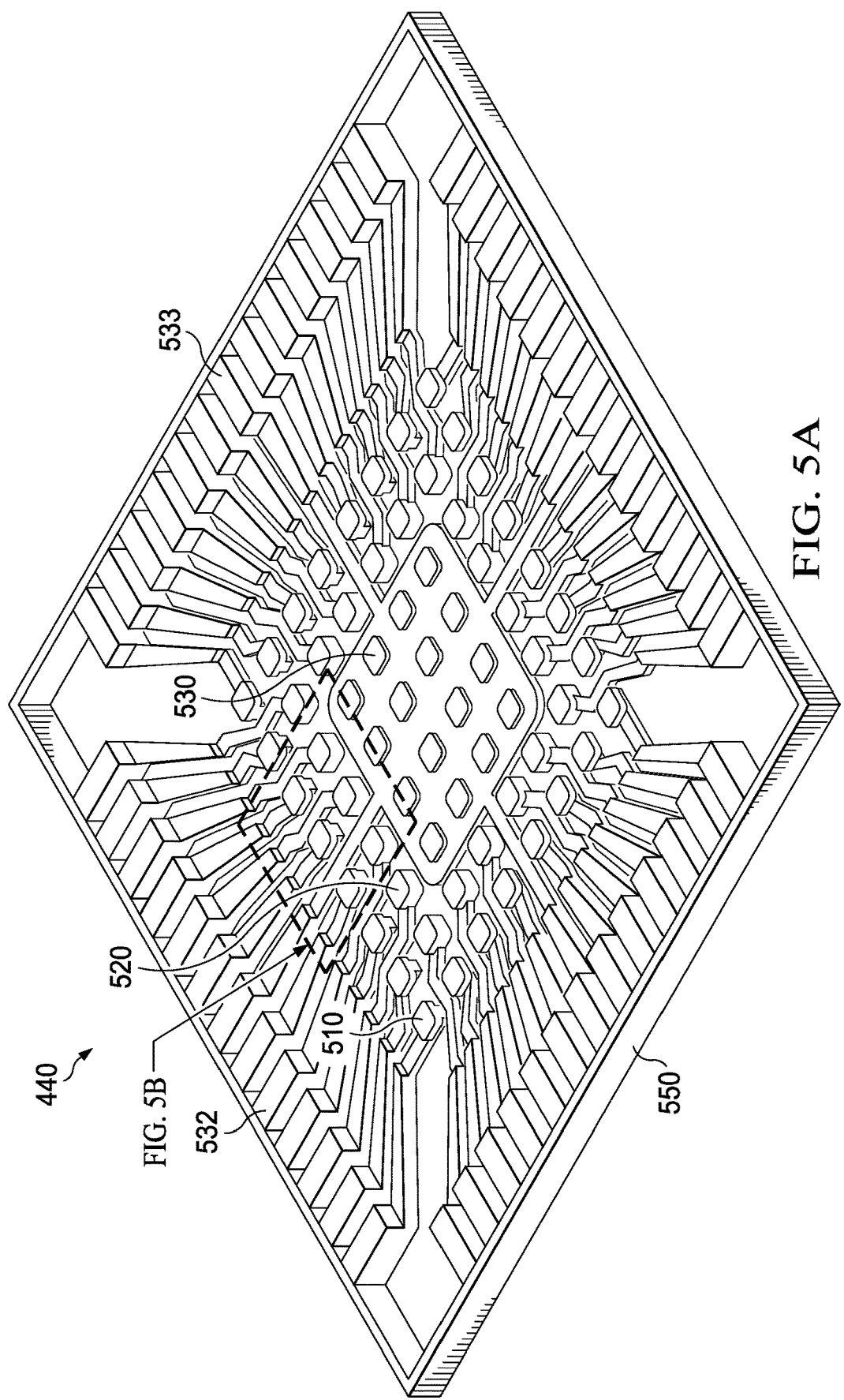
FIG. 5A is an illustration of an example multilevel leadframe.
Figure 5B:
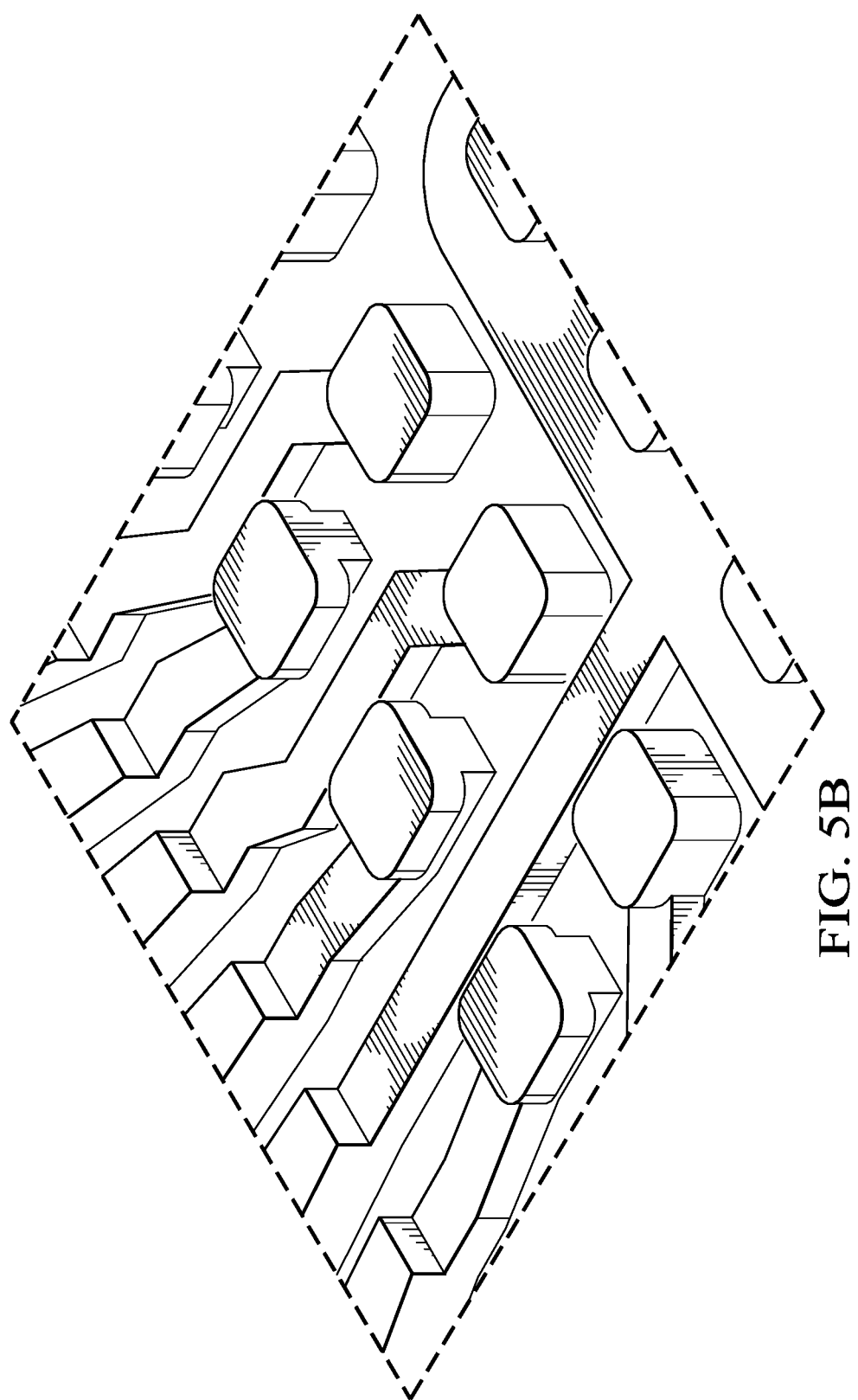
FIG. 5B is a more detailed view of a portion of FIG. 5A.

FIG. 5A is an isometric illustration of an example multilevel leadframe 440 that was formed using the process described with regard to FIGS. 4A-4G. FIG. 5B is a more detailed view of a portion of FIG. 5A. As was explained with regard to FIG. 3A, 3B, there is set of lead lines formed in a first level of the multilevel leadframe. Each lead line has a line width and is separated from an adjacent lead line by at least a lead line clearance distance. There is a first set of bond pads 510 formed in a second level of the multilevel leadframe arranged in an outer row. Each bond pad is separated from an adjacent bond pad by a bond pad clearance distance, and has a pad width that is greater than the line width. There is a second set of bond pads 520 arranged in an inner row. Each bond pad of the second set of bond pads is connected to one of the lead lines on the first level that is routed between adjacent bond pads in the first row.

Typically, bond pads in center array 530 may all be connected together to provide ground or a voltage supply to an attached chip since there is a limited number of lead lines that may be threaded through the first and second row of bond pads, such as lead lines 532, 533. Alternatively, center array 530 may be divided into two or more regions and supplied separately by lead lines such as 532, 533. Alternatively, one or more lead lines may be diverted from bond pads in the first or second row of bond pads and used to provide additional connectivity to regions within center array 530.

Frame 550 will be trimmed away once the leadframe is attached to a die and the package molding and contact plating processes are completed.

Figure 6:
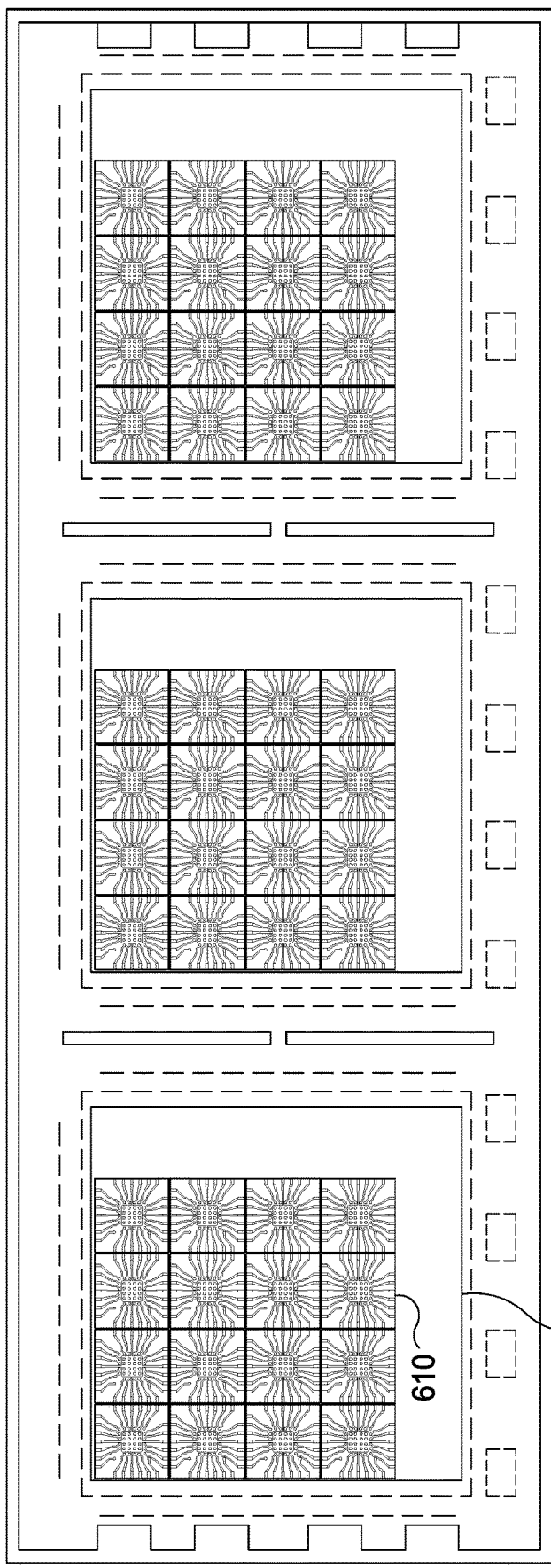
FIG. 6 is an illustration of an example leadframe tape with multiple individual leadframes formed therein.

FIG. 6 is an illustration of an example leadframe tape 600 with multiple individual leadframes 610 formed therein. Multiple units of a triple etched, multi-level leadframe may be fabricated in a strip form using a standard, known etching process that is performed three times, as described above in more detail. The number of units in a strip will depend on the size of each unit. The smaller the size of each individual units, the larger the number of units that may be fitted in a given size strip. In this example, sixteen individual leadframe units 610 are illustrated in each tape frame 620, but it should be understood that each tape frame may contain a larger or smaller number of leadframe units depending on the size of each leadframe unit and the size of the tape.

Figure 7:
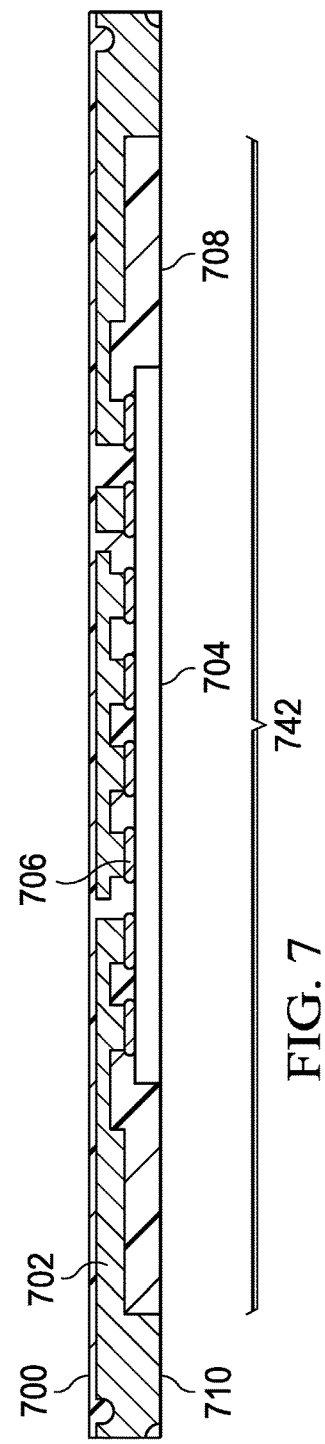
FIG. 7 is a cross-sectional view of a flip chip package with a chip scale package mounted to a multilevel leadframe.

FIG. 7 is a cross-sectional view of a flip chip package 700 that includes chip scale package 704 mounted to a multilevel leadframe 702. Solder bumps 706 are reflowed to provide connectivity between CSP 704 and leadframe 702. Molding compound 708 provides a protective coat.

In a typical package process flow, die 704 with solder bumps 706 is positioned on leadframe 702. Recall that each leadframe is part of a tape on which multiple die 704 are positioned. A reflow process then causes solder bumps 706 to melt and form a connection between the interface pads on die 704 and the bond pads on leadframe 702. Note that die cavity 742 is formed by the triple etch process. This provides a cavity in which die 704 is placed in a manner that the back of the die may contact the substrate to which the flip chip package is mounted. This may improve thermal performance A molding process is then performed to install mold compound 708 around each die and leadframe. The mold compound is then cured.

Substrate contact regions 710 of each lead line is then plated to prevent oxidation of the copper material. Contact regions 710 may be plated with gold or other precious metals, for example, or may be plated with a tin or lea-tin or other alloy for easy reflow attachment to a system substrate or printed circuit board.

Package singulation divides the encapsulated leadframe tape into individual flip chip packages. During this process, leadframe 550 is trimmed away so that all of the lead lines are electrically separated.

A multilevel, triple etch leadframe as described herein allows products with a high number of I/Os to be inserted into packages such as, for example: FCOL (flip chip on leadframe), QFN (quad-flat no-leads) packages. These packages in turn have good thermal performance because of the exposed die back. These packages have good reliability, provide good signal integrity, and are easier to assemble than wire bonded packages.

Other Embodiments

While the invention has been described with reference to illustrative embodiments, this description is not intended to be construed in a limiting sense. Various other embodiments of the invention will be apparent to persons skilled in the art upon reference to this description. For example, while a wet etch process has been described herein, other known or later developed wet or dry etching processes may be used to form a multilevel leadframe to provide minimal bond pad spacing as described herein.

In the examples described herein, the bond pads are all arranged in a uniform Cartesian array. In another embodiment, the bond pads may be arranged in a different manner; for example, the bond pads in the second row may be offset from the bond pads in the second row to allow straighter routing of the lead lines that connect to the second row bond pads.

In the examples illustrated herein, the bond pads are depicted as being rectangular or square. In another embodiment, the bond pads may have a different shape, such as circular, oval, etc.

Certain terms are used throughout the description and the claims to refer to particular system components. As one skilled in the art will appreciate, components and processes may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for forming a semiconductor package, the method comprising:
    attaching a semiconductor die to a leadframe, wherein the leadframe is made by:
        etching a conductive sheet from a first side to form a first region;
        etching the conductive sheet from the first side to form a second region, the first region thinner than the second region; and
        etching the conductive sheet from an opposite second side, wherein etching the conductive sheet from an opposite second side creates a plurality of lead lines between a plurality of bond pads;
    electrically connecting the semiconductor die to the leadframe; and molding portions of the semiconductor die and the leadframe using molding compound.

2. The method of claim 1 further comprising, prior to etching a conductive sheet from a first side to form a first region, masking the first side except for an area intended for the first region.

3. The method of claim 1 further comprising, prior to etching the conductive sheet from an opposite second side, masking portions of the second side opposite to the first region.

4. The method of claim 1, wherein etching the conductive sheet from the first side to form the second region creates a surface of the plurality of bond pads on the first side.

5. The method of claim 1, wherein the each of the plurality of lead lines includes a line width and being separated from an adjacent lead line by at least a lead line clearance distance.

6. The method of claim 4, wherein each of the plurality of bond pads includes a pad width and are separated from an adjacent bond pad by a bond pad clearance distance.

7. The method of claim 6, wherein the bond pad clearance distance is less than twice the lead line clearance distance.

8. The method of claim 6, wherein the bonds pad clearance distance is approximately equal to the lead line clearance distance.

9. The method of claim 1, wherein etching a conductive sheet from one side to form a thinner region also forms a die cavity within the leadframe.

10. A method for forming a semiconductor package, the method comprising:
   attaching a semiconductor die to a leadframe, wherein the leadframe is made by:
      etching a conductive sheet from a first side to form a first region;
      etching the conductive sheet from the first side to form a second region, the first region thinner than the second region, an area of the second region forming a surface of a plurality of bond pads; and
      etching the conductive sheet from an opposite second side and within an area of the first region to form a plurality of lead lines, each of the plurality of lead lines between two adjacent bond pads of the plurality of bond pads, and wherein the lead line is within the first region;
   electrically connecting the semiconductor die to the leadframe; and
   molding portions of the semiconductor die and the leadframe using molding compound.

11. The method of claim 10 further comprising, prior to etching a conductive sheet from a first side to form a first region, masking the first side except for an area intended for the first region.

12. The method of claim 10, wherein the each of the plurality of lead lines includes a line width and being separated from an adjacent lead line by at least a lead line clearance distance.

13. The method of claim 10, wherein each of the plurality of bond pads includes a pad width and are separated from an adjacent bond pad by a bond pad clearance distance.

14. The method of claim 13, wherein the bond pad clearance distance is less than twice the lead line clearance distance.

15. The method of claim 13, wherein the bonds pad clearance distance is approximately equal to the lead line clearance distance.

* * * * *